US005864100A

United States Patent [19]

Newman

[11] Patent Number: 5,864,100

[45] Date of Patent: Jan. 26, 1999

[54] SPEAKER ENCLOSURE

[76] Inventor: Ottis G. Newman, 9344 Bramble Dr., Baton Rouge, La. 70818

[21] Appl. No.: 859,063

[22] Filed: May 20, 1997

Related U.S. Application Data

[63] Continuation of Ser. No. 453,181, May 30, 1995, Pat. No. 5,644,109.

[51] Int. Cl.[6] .......... H05K 5/00

[52] U.S. Cl. .......... 181/156; 181/153; 181/199

[58] Field of Search .......... 181/153, 156, 181/196, 197, 199, 141; 381/86, 154, 159

[56] References Cited

U.S. PATENT DOCUMENTS

| | | | |
|---|---|---|---|
| 3,945,461 | 3/1976 | Robinson | 181/153 |
| 4,164,988 | 8/1979 | Virva | 181/156 |
| 4,567,959 | 2/1986 | Prophit | 181/156 |
| 4,756,382 | 7/1988 | Hudson, III | 181/156 |
| 4,790,407 | 12/1988 | Yaammoto et al. | 181/156 |
| 5,082,084 | 1/1992 | Ye-Ming | 181/153 |
| 5,191,177 | 3/1993 | Chi | 181/153 |
| 5,450,495 | 9/1995 | Goldfarb | 181/196 |

*Primary Examiner*—Khanh Dang
*Attorney, Agent, or Firm*—David L. Ray

[57] ABSTRACT

A speaker enclosure including a pair of tubular cylinders, one of which is slidable inside the other, the first of the tubular cylinders having one end closed, one end open, and an opening in the wall thereof, the second of the tubular cylinders having one end open and a speaker located in the other end thereof. The speaker enclosure may also include a pair of tubular cylinders, one of which is slidable inside the other, the first of the tubular cylinders having one end closed, one end open, a speaker in the open end, and an opening in the wall thereof, the second of the tubular cylinders having both ends open.

2 Claims, 5 Drawing Sheets

SPEAKER ENCLOSURE

This is a continuation of appplication Ser. No. 08/453,181, filed May 30, 1995 now U.S. Pat. No. 5,644,109.

BACKGROUND OF THE INVENTION

1. Field of the Invention

The present invention relates to audio speaker enclosures. More particularly, the present invention relates to audio speaker tube enclosures. Even more particularly, the present invention relates to audio speaker tube enclosures for motor vehicles.

2. Description of the Related Art

Audio speaker enclosures for placement in automobiles and trucks are known in the art. Typically such speakers are placed behind and above the rear seat of a vehicle having a front and rear seat, or on the cab floor behind the front seat of truck or other vehicle with a single bench seat, as shown in U.S. Pat. No. 4,567,959, which is hereby incorporated by reference.

A popular type of audio speaker in the tube speaker. The tube speaker provides enhanced perception and sound level for bass frequencies. The small acoustical environment of automobiles and trucks are particularly suited to audio tube speakers because of the small size of tube speakers and the ability of a speaker in a tube to be placed facing a corner wall of the truck or automobile at a desired distance therefrom.

Exemplary of the Patents of the related art are the following U.S. Pat. Nos.: 5,191,177; 5,103,482; 5,025,886; 4,756,382; 4,567,959; 4,472,605; and 2,002,390.

SUMMARY OF THE INVENTION

In accordance with the present invention there is provided a speaker enclosure including a pair of tubular cylinders, one of which is slidable inside the other, the first of the tubular cylinders having one end closed, one end open, and an opening in the wall thereof, the second of the tubular cylinders having one end open and a speaker located in the other end thereof. The speaker enclosure may also include a pair of tubular cylinders, one of which is slidable inside the other, the first of the tubular cylinders having one end closed, one end open, a speaker in the open end, and an opening in the wall thereof, the second of the tubular cylinders having both ends open.

BRIEF DESCRIPTION OF THE DRAWINGS

A

DESCRIPTION OF THE PREFERRED EMBODIMENTS

Figures 1, 2, 2A:
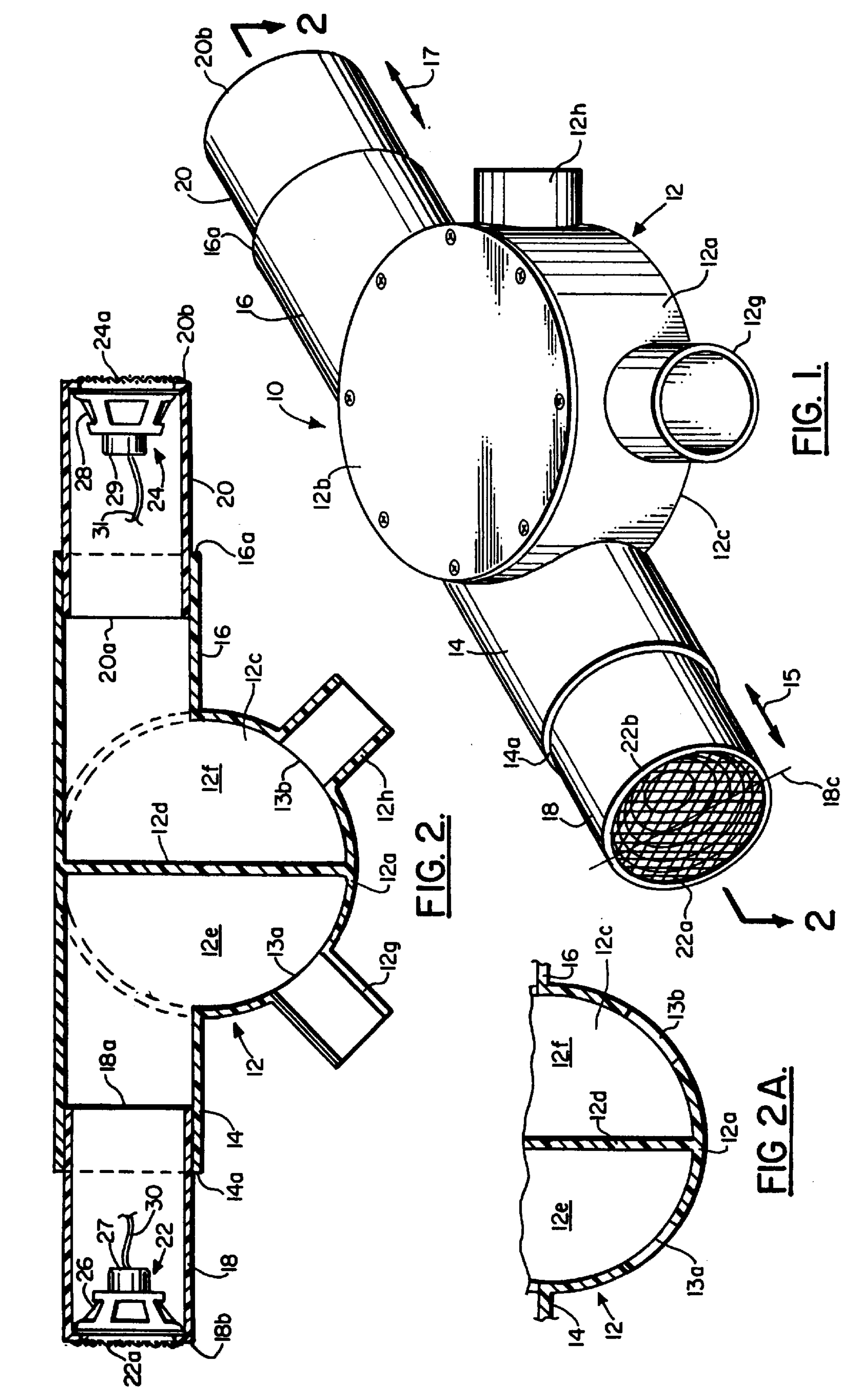
FIG. 1 is a perspective view of a first embodiment of the speaker enclosure of the invention having two slidable tubes and two speakers.
FIG. 2 is a cross-sectional view, partly cut-away, of the speaker enclosure of FIG. 1 taken along lines 2—2 of FIG. 1.
FIG. 2A is a partly cut-away, cross-sectional view of a first alternate embodiment of the speaker enclosure shown in FIGS. 1 and 2.

Referring now to the drawings, a first speaker enclosure of the present invention generally indicated by the numeral 10 is shown in FIGS. 1 and 2. Speaker enclosure 10 has a central cylindrical chamber generally indicated by the numeral 12. Cylindrical chamber 12 has a generally cylindrical outer wall 12*a* to which is rigidly connected circular top plate 12*b* and circular bottom plate 12*c*.

Cylindrical chamber 12 has a generally rectangular interior wall 12*d* rigidly connected to outer wall 12*a*. Interior wall 12*d* extends from top plate 12*b* to bottom plate 12*c* and divides cylindrical chamber 12 into two chambers 12*e* and 12*f* of equal size. Rectangular interior wall 12*d* prevents air in chamber 12*e* from entering chamber 12*f*, and therefore sound waves reflect off of wall 12*d* rather than traveling therearound.

Preferably, two cylindrical tubes 12*g* and 12*h*, open on both ends, are rigidly connected at one end to circular openings 13*a* and 13*b* in wall 12*a* of circular chamber 12. Preferably, tubes 12*g* and 12*h* are located equidistantly from wall 12*d* and from top 12*b*. Sound waves reflected from wall 12 can travel through tubes 12*g* and 12*h* to the exterior of speaker enclosure 10. The inside diameter of tubes 12*h* and 12*g* may be selected as desired provided the inside diameter is less than or equal to the height of generally cylindrical wall 12*a*. The length of tubes 12*h* and 12*g* may also be selected as desired to achieve the desired sound characteristics. Furthermore, if desired, additional tubes may be connected to cylindrical chamber 12.

Extending outwardly from central cylindrical chamber 12 and rigidly connected thereto are two axially cylindrical inner tubes 14 and 16, each having an open end 14*a* and 16*a*, respectively. The longitudinal axis of tube 14 is preferably aligned with the longitudinal axis of tube 16. Preferably the central axis of inner tubes 14 and 16 is perpendicular to the plane in which interior wall 12*d* lies. Inner tubes 14 and 16 preferably are preferably identical in length and diameter and are rigidly connected to cylindrical chamber 12 by molding, gluing, or the like. The inside diameter of tubes 14 and 16 may be selected as desired provided the inside diameter is less than or equal to the height of generally cylindrical wall 12*a*.

Slidably connected to the inside of tube 14 and axially aligned therewith is hollow cylindrical sliding tube 18, and slidably connected to the inside of tube 16 and axially aligned therewith is hollow cylindrical sliding tube 20. The longitudinal axis of sliding tube 18 is preferably aligned with the longitudinal axis of sliding tube 20. Sliding tubes 18 and 20 slide longitudinally inside tubes 14 and 16, respectively, as indicated by the arrows 15 and 17 in FIG. 1.

Sliding tubes 18 and 20 are preferably identical in length and diameter. Sliding tubes 18 and 20 are smaller in outside diameter than the outside diameter of tubes 14 and 16. The outside diameter of sliding tubes 18 and 20 is selected to enable a sliding frictional fit between the outside of tubes 18 and 20, and the inside of tubes 14 and 16, respectively, sufficient to hold sliding tubes 18 and 20 stationary after the tubes slide to the desired location inside of tubes 14 and 16.

Sliding tube 18 has an inside open end 18*a* and an outside open end 18*b*, and sliding tube 20 has an inside open end 20*a* and an outside open end 20*b*. Open end 18*b* defines a face plane 18*c* which is perpendicular to the longitudinal axis of sliding tube 18, and the open end 20*b* defines a face plane which is perpendicular to the longitudinal axis of sliding tube 20.

An audio driver\speaker generally indicated by the numeral 22 is rigidly connected to the open end 18*b* of sliding tube 18 and is protected by wire screen 22*a*, and an audio driver\speaker generally indicated by the numeral 24 is rigidly connected to the open end 20*b* of sliding tube 20 and protected by wire screen 24*a*. Driver/speaker 22 includes an acoustical generating cone 26 driven into vibration by a standard electromagnetic circuit member 27 of common construction as shown in FIG. 2, and driver/speaker 24 includes an acoustical generating cone 28 driven into vibration by a standard electromagnetic circuit member 29 of common construction as shown in FIG. 2. Audio electrical signals from a standard amplifier, not shown, supplied to electromagnetic circuit member 27 through insulated wire 30 vibrate cone 26 creating acoustical or sound energy, and audio electrical signals from a standard amplifier, not shown, supplied to electromagnetic circuit member 29 through insulated wire 31 vibrate cone 28 creating acoustical or sound energy. Speaker\drivers such as 22 and 24 are also commonly referred to in the art as "speakers".

Acoustical energy is radiated from the outside of cone 26 outwardly from the open end 18*b* of sliding tube 18, and acoustical energy is radiated from the outside of cone 28 outwardly from the open end 20*b* of sliding tube 20. Useful acoustical energy is radiated from the rear of cone 26 into sliding tube 18 and chamber 12*e*, and useful acoustical energy is radiated from the rear of cone 28 into sliding tube 20 and chamber 12*f*. Acoustical energy entering chamber 12*e* from cone 26 reflects off of wall 12*d* and a portion of the acoustical energy exits through tube 12*g* to the outside of speaker enclosure 10, and acoustical energy entering chamber 12*f* from cone 28 reflects off of wall 12*d* and a portion of the acoustical energy exits through tube 12*h* to the outside of speaker enclosure 10.

To vary the acoustical quality and characteristics of the acoustical energy emanating from tubes 12*g* and 12*h*, sliding tubes 18 and 20 may be slidably moved to various longitudinal locations within tubes 14 and 16, respectively, as desired by the listener. Speaker enclosure 10 may thus be "tuned" by the listener in the vehicle in which speaker enclosure 10 is located by sliding tubes 18 and 20 to various locations within tubes 14 and 16, respectively to achieve a desired acoustical effect.

In FIG. 2A is shown an alternate embodiment of cylindrical chamber 12 in which tubes 12*g* and 12*h* are omitted. Circular openings 13*a* and 13*b* in wall 12*a* permit sound waves in chambers 12*e* and 12*f* to be released to the exterior of cylindrical chamber 12.

Figures 2B, 3:
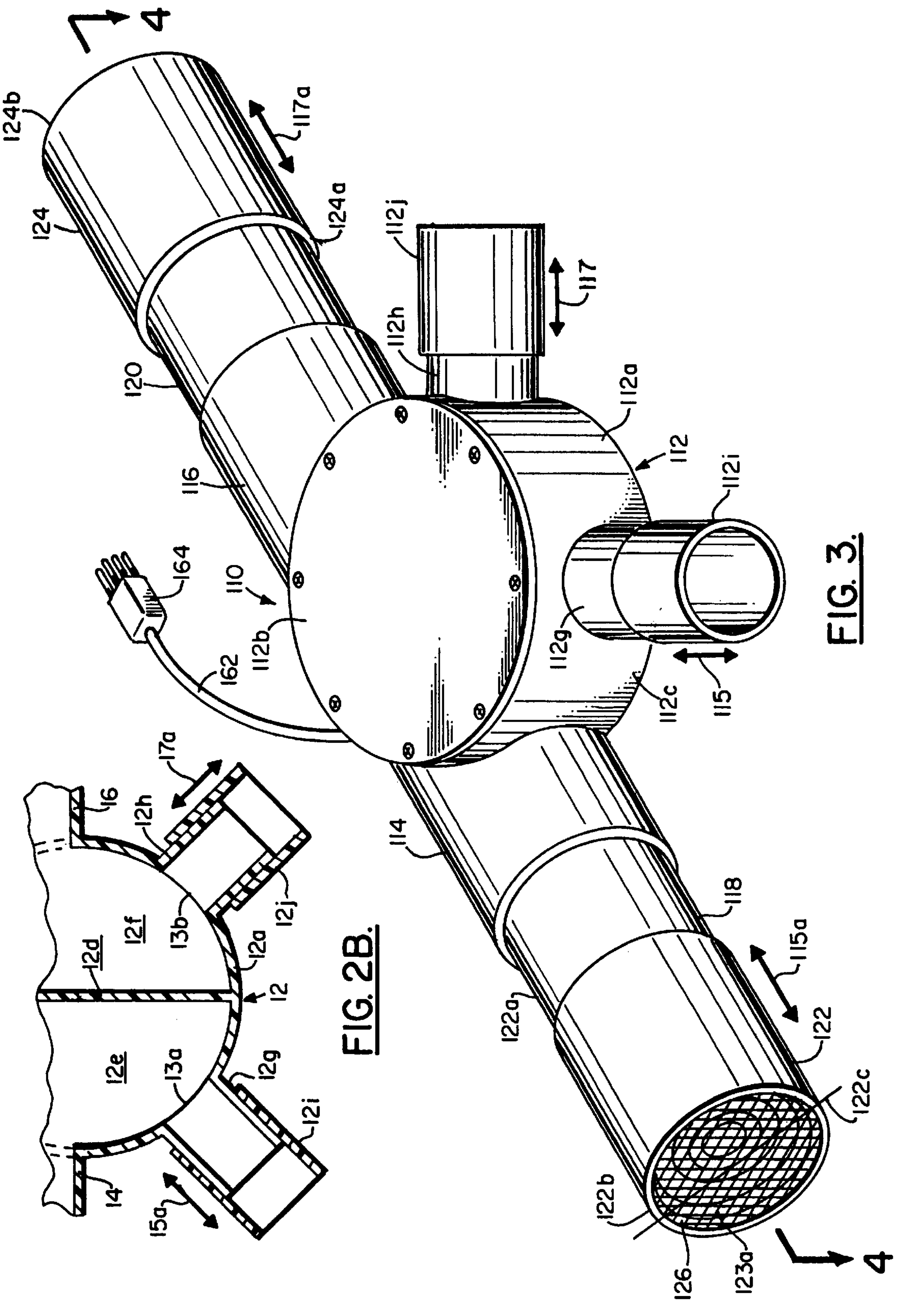
FIG. 2B is a partly cut-away, cross-sectional view of a second alternate embodiment of the speaker enclosure shown in FIGS. 1 and 2.
FIG. 3 is a perspective view of a second embodiment of the speaker enclosure of the invention having four slidable tubes and four speakers.

In FIG. 2B is shown a second alternate embodiment of cylindrical chamber 12 in which two hollow cylindrical sliding tubes 12*i* and 12*j* are slidably received on the outside of tubes 12*g* and 12*h*, respectively. The longitudinal axis of sliding tube 12*i* is aligned with the longitudinal axis of tube 12*g*, and the longitudinal axis of sliding tube 12*j* is aligned with the longitudinal axis of tube 12*g*. Sliding tubes 12*i* and 12*j* slide longitudinally on the outside of tubes 12*g* and 12*h*, respectively, as indicated by the arrows 15*a* and 17*a* in FIG. 2A. Sliding tubes 12*i* and 12*j* are preferably identical in length and diameter. Sliding tubes 12*i* and 12*j* are larger in outside diameter than the outside diameter of tubes 12*g* and 12*h*, and the inside diameter of sliding tubes 12*i* and 12*j* is selected to enable a sliding frictional fit between the outside of tubes 12*g* and 12*h*, and the inside of tubes 12*i* and 12*j*, respectively, sufficient to hold sliding tubes 12*i* and 12*j* stationary after the tubes 12*i* and 12*j* slide to the desired location on the outside of tubes 12*g* and 12*h*, respectively.

Therefore, in the embodiment shown in FIG. 2A, the acoustical energy emanating from tubes 12*g* and 12*h* can be varied by sliding tubes 12*i* and 12*j* longitudinally to various desired positions on tubes 12*g* and 12*h* in addition to sliding tubes 18 and 20 longitudinally to various positions on tubes 14 and 16. Speaker enclosure 10 may thus be "tuned" by the listener in the vehicle in which speaker enclosure 10 is located by moving sliding tubes 18, 20, 12*i* and 12*j* to achieve a desired acoustical effect.

Figure 4:
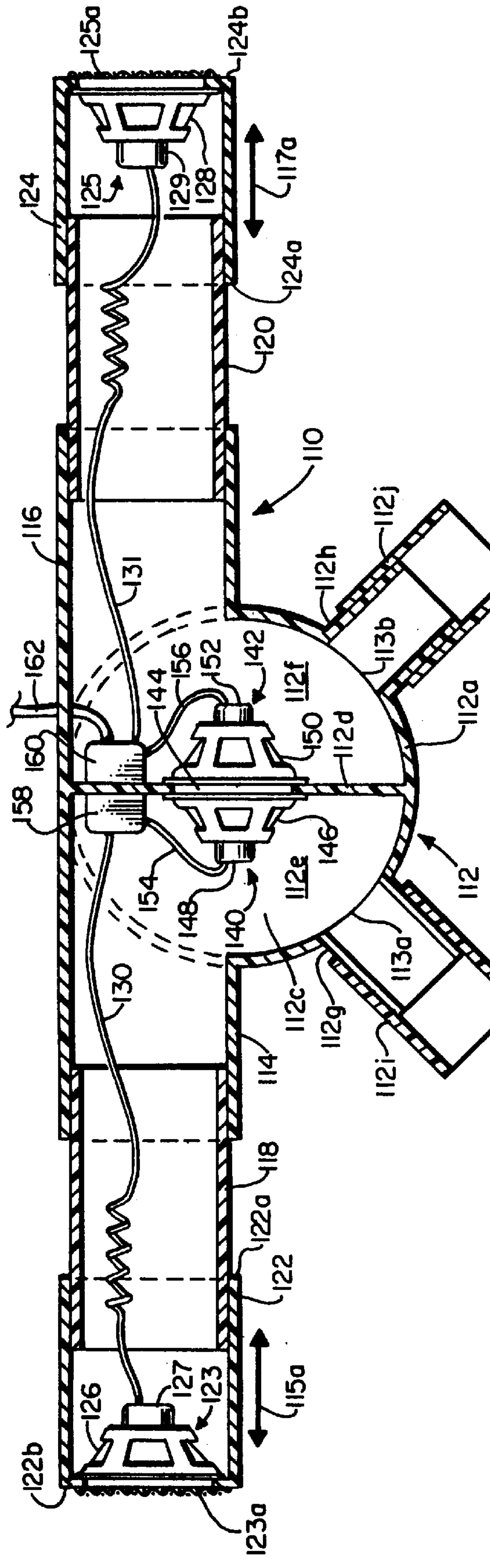
FIG. 4 is a cross-sectional view, of the speaker enclosure of FIG. 3 taken along lines 4—4 of FIG. 3.

Referring now to FIGS. 3 and 4, there is shown a second embodiment of a speaker enclosure of the present invention generally indicated by the numeral 110. Speaker enclosure 110 has a central cylindrical chamber generally indicated by the numeral 112.

Cylindrical chamber 112 has a generally cylindrical outer wall 112*a* to which is rigidly connected circular top plate 112*b* and circular bottom plate 112*c*. Cylindrical chamber 112 has a rectangular interior wall 112*d* rigidly connected to outer wall 112*a* which extends from the top plate 112*b* to the bottom plate 112*c* to divide cylindrical chamber 112 into two chambers 112*e* and 112*f* of equal size. Wall 112*d* prevents air in chamber 112*e* from entering chamber 112*f*, and therefore sound waves reflect off of wall 112*d* rather than traveling therearound.

Preferably, two cylindrical tubes 112*g* and 112*h*, open on both ends, are rigidly connected at one end to circular openings 113*a* and 113*b* in wall 112*a* of cylindrical chamber 112. Preferably, tubes 112*g* and 112*h* are located equidistantly from wall 112*d*, and from top plate 112*b* and bottom plate 112*c*. Sound waves reflected from wall 112 can travel through tubes 112*h* and 112*g* to the exterior of speaker enclosure 110. The inside diameter of tubes 112*h* and 112*g* may be selected as desired provided the inside diameter is less than or equal to the height of cylindrical wall 112*a*. The length of tubes 12*h* and 12*g* may also be selected as desired to achieve desired sound characteristics. Furthermore, if desired, additional tubes may be connected to cylindrical chamber 112.

Speaker enclosure 110 has two hollow cylindrical sliding tubes 112*i* and 112*j* slidably received on the outside of tubes 112*g* and 112*h*, respectively. Sliding tubes 112*i* and 112*j* are preferred, but they may be omitted if desired. The longitudinal axis of sliding tube 112*i* is aligned with the longitudinal axis of tube 112*g*, and the longitudinal axis of sliding tube 112*j* is aligned with the longitudinal axis of tube 112*g*. Sliding tubes 112*i* and 112*j* slide longitudinally on the outside of tubes 112*g* and 112*h*, respectively, as indicated by the arrows 115 and 117 in FIG. 3. Sliding tubes 112*i* and 112*j* are preferably identical in length and diameter. Sliding tubes 112*i* and 112*j* are larger in outside diameter than the outside diameter of tubes 112*g* and 112*h*, and the inside diameter of sliding tubes 112*i* and 112*j* is selected to enable a sliding frictional fit between the outside of tubes 112*g* and 112*h*, and the inside of tubes 112*i* and 112*j*, respectively, sufficient to hold sliding tubes 112*i* and 112*j* stationary after the tubes 112*i* and 112*j* slide longitudinally to the desired location on the outside of tubes 112*g* and 112*h*, respectively.

Extending outwardly from central cylindrical chamber 112 and rigidly connected thereto are two axially aligned cylindrical inner tubes 114 and 116. The longitudinal axis of tube 114 is preferably aligned with the longitudinal axis of tube 116. Preferably the central axis of inner tubes 114 and 116 is perpendicular to the plane in which interior wall 112*d* lies. Inner tubes 114 and 116 preferably are identical in length and diameter and are rigidly connected to cylindrical chamber 112 by molding, gluing, or the like.

Rigidly connected to tube 114 and axially aligned therewith is middle tube 118, and rigidly connected to tube 116 and axially aligned therewith is middle tube 120. Middle tubes 118 and 120 are preferably identical in length and diameter, and middle tubes 118 and 120 are preferably rigidly connected to the inside of tubes 114 and 116, respectively, by molding, gluing, force fitting or the like. Preferably, tubes 118 and 120 are smaller in outside diameter than the outside diameter of tubes 114 and 116. If desired, middle tubes 118 and 120 could be eliminated as is shown in FIGS. 1 and 2, and tubes 122 and 124 could be made sufficiently large in diameter to be slidably received on the outside of inner tubes 114 and 116, respectively.

Slidably connected to the outside of middle tube 118 and axially aligned therewith is hollow cylindrical sliding tube 122, and slidably connected to the outside of middle tube 120 and axially aligned therewith is hollow cylindrical sliding tube 124. The longitudinal axis of sliding tube 122 is preferably aligned with the longitudinal axis of sliding tube 124. Sliding tubes 122 and 124 slide longitudinally on the outside of middle tubes 118 and 120, respectively, as indicated by the arrows 115*a* and 117*a* in FIG. 3.

Sliding tubes 122 and 124 are preferably identical in length and diameter. Sliding tubes 122 and 124 are larger in outside diameter than the outside diameter of tubes 118 and 120, and the inside diameter of sliding tubes 122 and 124 is selected to enable a sliding frictional fit between the outside of tubes 118 and 120, and the inside of tubes 122 and 124, respectively, sufficient to hold sliding tubes 122 and 124 stationary after the tubes 122 and 124 slide to the desired location outside of tubes 118 and 120, respectively.

Sliding tube 122 has an inside open end 122*a* and an outside open end 122*b*, and sliding tube 124 has an inside open end 124*a* and an outside open end 124*b*. Open end 122*b* defines a face plane 122*c* which is perpendicular to the longitudinal axis of sliding tube 122, and the open end 124*b* defines a face plane which is perpendicular to the longitudinal axis of sliding tube 124.

An audio driver\speaker generally indicated by the numeral 123 is rigidly connected to the open end 122*b* of sliding tube 122 and protected by wire screen 123*a*, and an audio driver\speaker generally indicated by the numeral 125 is rigidly connected to the open end 124*b* of sliding tube 124 and protected by wire screen 125*a*. Driver/speaker 123 includes an acoustical generating cone 126 driven into vibration by a standard electromagnetic circuit member 127 of common construction as shown in FIG. 4, and driver/speaker 125 includes an acoustical generating cone 128 driven into vibration by a standard electromagnetic circuit member 129 of common construction as shown in FIG. 4. Audio electrical signals from a standard amplifier, not shown, supplied to electromagnetic circuit member 127 through insulated wire 130 vibrate cone 126 creating acoustical or sound energy, and audio electrical signals from a standard amplifier, not shown, supplied to electromagnetic circuit member 129 through insulated wire 131 vibrate cone 128 creating acoustical or sound energy.

Two driver\speakers 140 and 142 are rigidly connected to interior wall 112*d* as shown in FIG. 4. Speaker\drivers 140 and 142 surround opening 144 in wall 112*d*. Driver/speaker 140 includes an acoustical generating cone 146 driven into vibration by a standard electromagnetic circuit member 148 of common construction as shown in FIG. 4, and driver/speaker 142 includes an acoustical generating cone 150 driven into vibration by a standard electromagnetic circuit member 152 of common construction as shown in FIG. 4. Audio electrical signals from a standard amplifier, not shown, supplied to electromagnetic circuit member 148 through insulated wire 154 vibrate cone 146 creating acoustical or sound energy, and audio electrical signals from a standard amplifier, not shown, supplied to electromagnetic circuit member 152 through insulated wire 156 vibrate cone 150 creating acoustical or sound energy.

As shown in FIG. 4, insulated wires 130 and 154 are connected to junction box 158 which is connected to wall 112*d*, and insulated wires 131 and 156 are connected to junction box 160 which is connected to wall 112*d*. Junction boxes 158 and 160 may be omitted if desired, and wires 130, 131, 154, and 156 could extend directly from insulated wire bundle 162. Insulated wire bundle 162 connected to junction box 160 and to plug 164*c* having four terminals for supplies audio signals from a standard amplifier, not shown, to wires 130, 131, 154, and 156. Two of the four wires contained in wire bundle 162 extend through wall 112*d* from junction box 160 to junction box 158 and are connected to wires 130 and wires 154.

Acoustical energy is radiated from the outside of cone 126 outwardly from the open end 122*b* of sliding tube 122, and acoustical energy is radiated from the outside of cone 128 outwardly from the open end 124*b* of sliding tube 124. Useful acoustical energy is radiated from the rear of cone 126 into sliding tube 122 and chamber 112*e*, and useful acoustical energy is radiated from the rear of cone 128 into sliding tube 124 and chamber 112*f*. Acoustical energy entering chamber 112*e* from the rear of cone 126 reflects off of wall 112*d*, junction box 158, and driver/speaker 140, and a portion of the reflected acoustical energy exits through tube 112*g* to the outside of speaker enclosure 110. Acoustical energy entering chamber 112*f* from the rear of cone 126 reflects off of wall 112*d*, junction box 160, and driver/speaker 142, and a portion of the reflected acoustical energy exits through tube 112*h* to the outside of speaker enclosure 110. Acoustical energy emanating from cones 146 and 150 exits through tubes 112*g* and 112*h*, respectively.

To vary the acoustical quality and characteristics of the acoustical energy emanating from tubes 112*g* and 112*h*, sliding tubes 122 and 124 may be slidably moved longitudinally to various locations on middle tubes 118 and 120, respectively, as desired by the listener. Speaker enclosure 110 may thus be "tuned" by the listener in the vehicle in which speaker enclosure 110 is located by sliding tubes 122 and 124 to various desired locations on tubes 118 and 120, respectively to achieve a desired acoustical effect.

The acoustical energy emanating from tubes 112*g* and 112*h* can be varied by sliding tubes 112*i* and 112*j* longitudinally to various desired positions on tubes 112*g* and 112*h* in addition to sliding tubes 122 and 124 longitudinally to various positions on tubes 118 and 120. Speaker enclosure 110 may thus be "tuned" by the listener in the vehicle in which speaker enclosure 110 is located by moving sliding tubes 122, 124, 112*i* and 112*j* longitudinally to achieve a desired acoustical effect. If the additional tuning available with sliding tubes 112*i* and 112*j* is not desired, sliding tubes 112*i* and 112*j* can be omitted from speaker enclosure 110.

Figure 5:
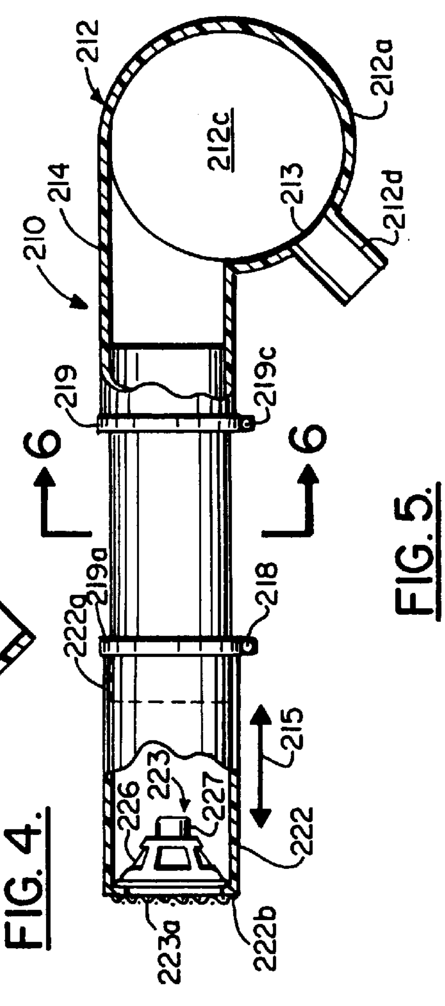
FIG. 5 is a side elevational view, partly cross-sectional, of a third embodiment of the speaker enclosure of the invention having a single speaker.
Figure 6:
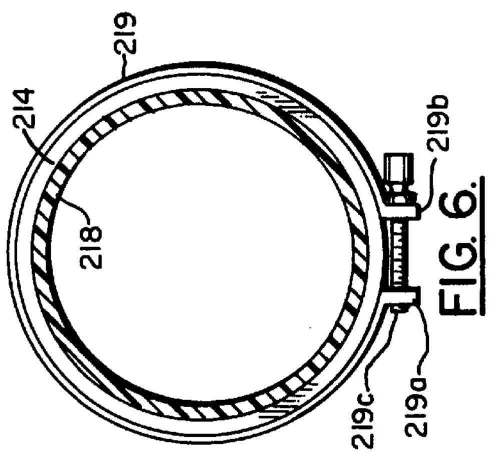
FIG. 6 is a cross-sectional view taken along lines 6—6 of FIG. 5.

In FIGS. 5 and 6 is shown a third embodiment generally indicated by the numeral 210. Speaker enclosure 210 has a central cylindrical chamber generally indicated by the numeral 212. Cylindrical chamber 212 has a generally cylindrical outer wall 212*a* to which is rigidly connected circular top, not shown, identical to circular top plate 112*b* shown in FIG. 3, and a circular bottom plate 212*c*. If desired, 212 could have shapes other than cylindrical A cylindrical tube 212*d*, open on both ends, is rigidly connected to opening 213 in wall 212*a* of cylindrical chamber 212. Preferably, tube 212*d* is located equidistantly from bottom 212*c* and the top, not shown, of cylindrical chamber 212. Sound waves reflected from wall 212*a* can travel through tube 212*d* to the exterior of speaker enclosure 210. The inside diameter and length of tube 212*d* may be selected as desired provided the inside diameter is less than or equal to the height of generally cylindrical wall 212*a*.

Extending outwardly from central cylindrical chamber 212 and rigidly connected thereto is inner tube 214. Inner tube 214 is rigidly connected to cylindrical chamber 212 by molding, gluing, or the like.

Rigidly connected to the inside of inner tube 214 and axially aligned therewith is middle tube 218. Middle tube 218 can be rigidly connected to the inside of tube 214 by molding, gluing, force fitting or the like, or by clamp 219. As can be seen in FIGS. 5 and 6, clamp 219 is a conventional clamp which extends around the outside of inner tube 214 and has two internally threaded protuberances 219*a* and 219*b* for receiving threaded bolt 219*c*.

Slidably connected to the outside of tube 218 and axially aligned therewith is tube 222. The inner end 222*a* of tube 222 is slidably connected to the outside of tube 218. Sliding tube 218 slides longitudinally on the outside of middle tube 218 as indicated by the arrow 215. If desired, middle tube 218 could be eliminated as is shown in FIGS. 1 and 2, and tube 222 could be made sufficiently large in diameter to be slidably received on the outside of inner tube 214. The inside diameter of sliding tube 222 is selected to enable a sliding frictional fit between the outside of middle tube 118 and the inside of sliding tube 222 sufficient to hold sliding tube 222 stationary on the outside of middle tube 218 after tube 222 slides to the desired location on middle tube 218.

Sliding tube 222 has an inside open end 222*a* and an outside open end 222*b*. Open end 222*b* defines a face plane which is perpendicular to the longitudinal axis of sliding tube 222. If desired, open end 222*b* may be clamped onto tube 218 by claim 219*a* which is identical to clamp 219.

An audio driver\speaker generally indicated by the numeral 223 is rigidly connected to the open end 222*b* of sliding tube 222. Driver/speaker 223 includes an acoustical generating cone 226 protected by wire screen 223*a* driven into vibration by a standard electromagnetic circuit member 227 of common construction as shown in FIG. 5. Audio electrical signals from a standard amplifier, not shown, supplied to electromagnetic circuit member 227 through a wire, not shown vibrate cone 226 creating acoustical or sound energy.

Acoustical energy is radiated from the outside of cone 226 outwardly from the open end 222*b* of sliding tube 222. Useful acoustical energy is radiated from the rear of cone 226 into sliding tube 222 and cylindrical chamber 212. Acoustical energy entering cylindrical chamber 212 from cone 226 reflects off of wall 212*a* and a portion of the acoustical energy exits through tube 212*c* to the outside of speaker enclosure 210.

To vary the acoustical quality and characteristics of the acoustical energy emanating from tube 212, sliding tube 222 may be slidably moved to varying longitudinal locations on the outside of tube 218, respectively, as desired by the listener. Speaker enclosure 210 may thus be "tuned" by the listener in the vehicle in which speaker enclosure 210 is located by sliding tube 222 to various locations on the outside of tube 218.

Figure 7:
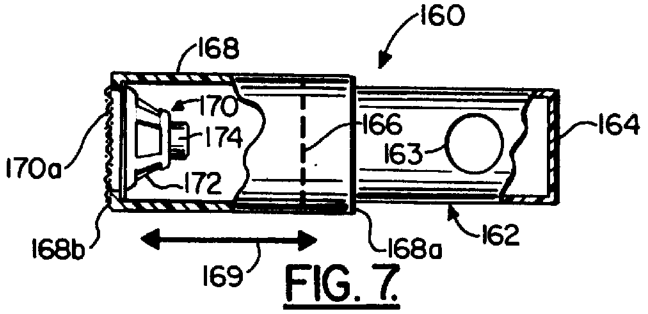
FIG. 7 is a perspective view, partly cut-away, of a fourth embodiment of the speaker enclosure of the invention.

In FIG. 7 is shown a fourth embodiment of the invention generally indicated by the numeral 160. Speaker enclosure 160 includes a hollow cylindrical tube generally indicated by the numeral 162 having a circular wall 164 rigidly connected to one end. Circular wall 164 closes one end of tube 162. The other end 166 of tube 162 is open. A circular opening 163 in the sidewall of tube 162 allows air from the outside of speaker enclosure 160 to move in and out of tube 162. Therefore sound waves reflect off of the interior cylindrical sidewalls of tube 162 and off of wall 164 rather than traveling therearound, and escape from the interior of tube 162 through opening 163. If desired, a hollow tube could be fitted in opening 163 similar to tube 212*d* in FIG. 5.

Slidably connected to the outside of the open end 166 of tube 162 is hollow cylindrical sliding tube 168. The longitudinal axis of sliding tube 168 is aligned with the longitudinal axis of tube 162. Sliding tube 168 slides longitudinally on the outside of tube 162 as indicated by the arrow 169 in FIG. 7.

Sliding tube 168 is larger in outside diameter than the outside diameter of tube 162, and the outside diameter of sliding tube 168 is selected to enable a sliding frictional fit between the inside of sliding tube 168, and the outside of tube 162 sufficient to hold sliding tube 162 and 168 stationary after the tubes slide to the desired longitudinal location relative to each other.

Sliding tube 168 has an inside open end 168*a* and an outside open end 168*b*. Open end 168*b* defines a face plane which is perpendicular to the longitudinal axis of sliding tube 168.

An audio driver\speaker generally indicated by the numeral 170 is rigidly connected to the open end 168*b* of sliding tube 168. Driver/speaker 170 includes an acoustical generating cone 172 protected by wire screen 170*a* driven into vibration by a standard electromagnetic circuit member 174 of common construction as shown in FIG. 7. Audio electrical signals from a standard amplifier, not shown, supplied to electromagnetic circuit member 174 through an insulated wire, not shown, vibrate cone 170, creating acoustical or sound energy.

Acoustical energy is radiated from the outside of cone 172 outwardly from the open end 168*b* of sliding tube 168. Useful acoustical energy is radiated from the rear of cone 172 into sliding tube 162. Acoustical energy entering tube 162 from cone 172 reflects off of wall 164 and the interior sidewalls of tube 162, and a portion of the acoustical energy exits through opening 163 to the outside of speaker enclosure 160.

To vary the acoustical quality and characteristics of the acoustical energy emanating from opening 163, sliding tube 168 may be slidably moved to varying longitudinal locations on the outside of tube 162 as desired by the listener. Speaker enclosure 160 may thus be "tuned" by the listener in the vehicle in which speaker enclosure 160 is located by sliding tube 168 to various locations on tube 162 to achieve a desired acoustical effect.

Figure 8:
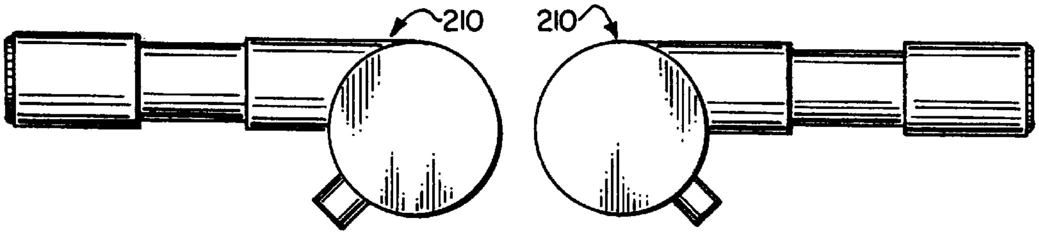
FIG. 8 is a side elevational view of a pair of aligned speakers of the fifth embodiment of the invention.

In FIG. 8, two speaker enclosures 210 shown in FIGS. 5 and 6 are shown in alignment such as they would be when installed in a vehicle behind a seat similar to the alignment shown in FIG. 2 of U.S. Pat. No. 4,566,949, which has been incorporated by reference.

Figure 9:
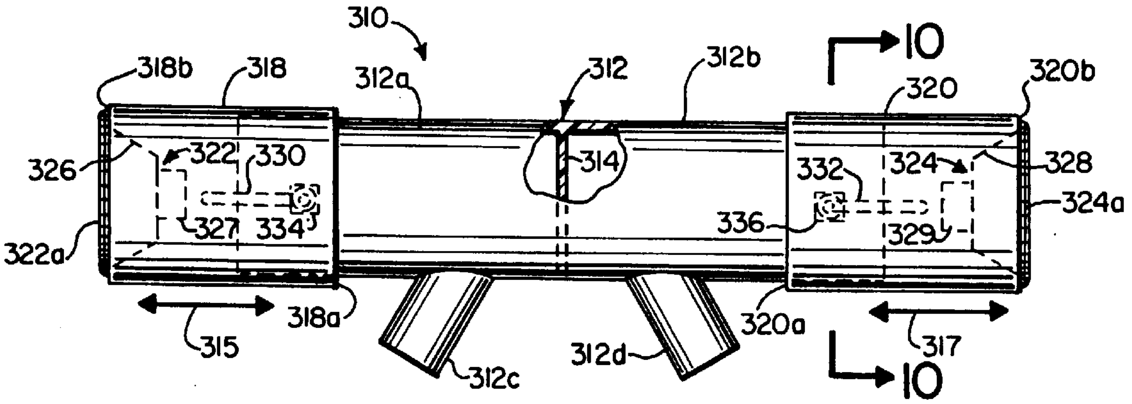
FIG. 9 is a side elevational view, partly-cut away, of a fifth embodiment of the invention having two slidable tubes and two speakers.
Figure 10:
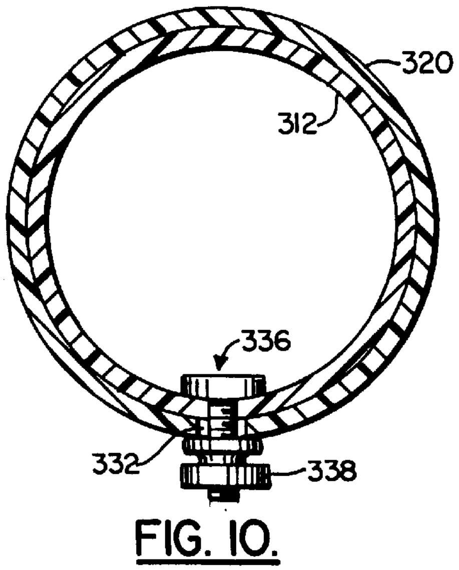
FIG. 10 is a cross-sectional view taken along lines 10—10 of FIG. 9.

A fifth embodiment of the invention is shown in FIGS. 9 and 10 generally indicated by the numeral 310. Speaker enclosure 310 includes a hollow cylindrical tube generally indicated by the numeral 312 having a centrally located circular wall 314 rigidly connected to the inside thereof. Circular wall 314 divides tube 312 into two cylindrical chambers 312*a* and 312*b*. Circular wall 314 prevents air in chamber 312*a* from entering chamber 312*b*, and therefore sound waves reflect off of wall 314 rather than traveling therearound.

Preferably, two hollow cylindrical tubes 312*c* and 312*d*, open on both ends, are rigidly connected to chamber 312*a* and chamber 312*b*, respectively. Preferably, tubes 312*c* and 312*d* are identically in size and are located equidistantly from wall 314 and their longitudinal axes lie in the same plane at equal acute angles with circular wall 314.

Sound waves reflected from wall 314 can travel through tubes 312*c* and 312*d* to the exterior of speaker enclosure 310. The inside diameter of tubes 312*c* and 312*d* may be selected as desired provided the inside diameter is less than or equal to the diameter of tube 312.

Slidably connected to the outside of one end of tube 312 is hollow cylindrical sliding tube 318, and slidably connected to the outside of the other end of tube 312 is hollow cylindrical sliding tube 320. The longitudinal axis of sliding tube 318 is aligned with the longitudinal axis of sliding tube 320. Sliding tubes 318 and 320 slide longitudinally on the outside of tube 312 as indicated by the arrows 315 and 317 in FIG. 9.

If desired, longitudinal slots 330 and 332 may be formed in sliding tubes 318 and 320 respectively. Two bolts 334 and 336 are place in tube 312 and fitted through slots 330 and 332, respectively. A nut 338 shown in FIG. 9 may be threaded onto each of the bolts 334 and 336 to lock tubes 318 and 320 in a desired location.

Sliding tubes 318 and 320 are preferably identical in length and diameter. Sliding tubes 318 and 320 are larger in outside diameter than the outside diameter of tube 312, and the inside diameter of sliding tubes 318 and 320 is selected to enable a sliding frictional fit between the inside of tubes 318 and 320, and the outside of tube 312 sufficient to hold sliding tubes 318 and 320 stationary after the tubes slide to the desired location on the outside of tube 312.

Sliding tube 318 has an inside open end 318*a* and an outside open end 318*b*, and sliding tube 320 has an inside open end 320*a* and an outside open end 320*b*. Open end 318*b* defines a face plane which is perpendicular to the longitudinal axis of sliding tube 318, and the open end 320*b* defines a face plane which is perpendicular to the longitudinal axis of sliding tube 320.

An audio driver\speaker generally indicated by the numeral 322 is rigidly connected to the open end 318*b* of sliding tube 318, and an audio driver\speaker generally indicated by the numeral 324 is rigidly connected to the open end 320*b* of sliding tube 320. Driver/speaker 322 includes an acoustical generating cone 326 protected by wire screen 322*a* driven into vibration by a standard electromagnetic circuit member 327 of common construction as shown in FIG. 9, and driver/speaker 324 includes an acoustical generating cone 328 protected by wire screen 324*a* driven into vibration by a standard electromagnetic circuit member 329 of common construction as shown in FIG. 9. Audio electrical signals from a standard amplifier, not shown, supplied to electromagnetic circuit member 327 through an insulated wire, not shown, vibrate cone 326 creating acoustical or sound energy, and audio electrical signals from a standard amplifier, not shown, supplied to electromagnetic circuit member 329 through an insulated wire, not shown, vibrate cone 328 creating acoustical or sound energy.

Acoustical energy is radiated from the outside of cone 326 outwardly from the open end 318*b* of sliding tube 318, and acoustical energy is radiated from the outside of cone 328 outwardly from the open end 320*b* of sliding tube 320. Useful acoustical energy is radiated from the rear of cone 326 into sliding tube 318 and chamber 312*a*, and useful acoustical energy is radiated from the rear of cone 328 into sliding tube 320 and chamber 312*b*. Acoustical energy entering chamber 312*a* from cone 326 reflects off of wall 314 and a portion of the acoustical energy exits through tube 312*c* to the outside of speaker enclosure 310, and acoustical energy entering chamber 312*b* from cone 328 reflects off of wall 314 and a portion of the acoustical energy exits through tube 312*d* to the outside of speaker enclosure 310.

To vary the acoustical quality and characteristics of the acoustical energy emanating from tubes 312*c* and 312*d*, sliding tubes 318 and 320 may be slidably moved to varying longitudinal locations on the outside of tube 312 as desired by the listener. Speaker enclosure 310 may thus be "tuned" by the listener in the vehicle in which speaker enclosure 310 is located by sliding tubes 318 and 320 to various locations on tube 312 to achieve a desired acoustical effect.

Figure 11:
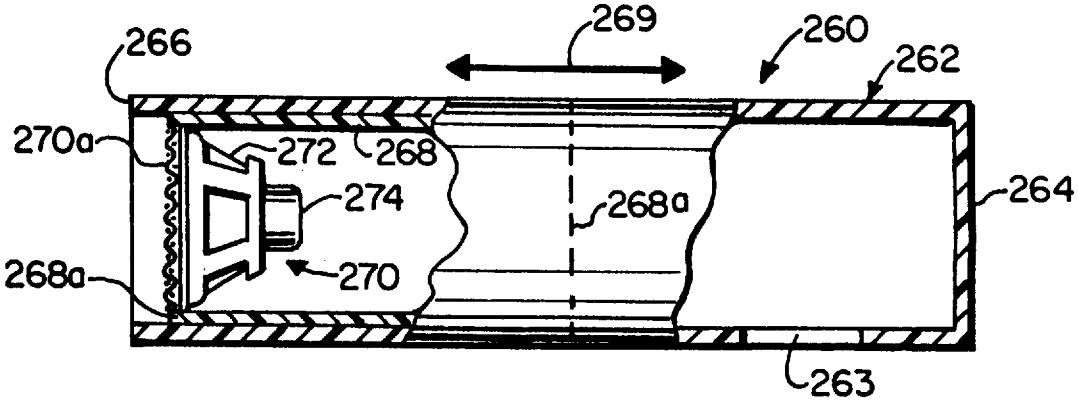
FIG. 11 is a perspective view, partly cut-away, of a sixth embodiment of the speaker enclosure of the invention.

In FIG. 11 is shown a sixth embodiment of the invention generally indicated by the numeral 260. Speaker enclosure 260 includes a hollow cylindrical tube generally indicated by the numeral 262 having a circular wall 264 rigidly connected to one end. Circular wall 264 closes one end of tube 262. The other end 266 of tube 262 is open. A circular opening 263 in the sidewall of tube 262 allows air from the outside of speaker enclosure 260 to move in and out of tube 262. Therefore sound waves reflect off of the interior cylindrical sidewalls of tube 262 and off of wall 264 rather than traveling therearound, and escape from the interior of tube 262 through opening 263. If desired, a hollow tube could be fitted in opening 263 similar to tube 212*d* in FIG. 5.

Slidably connected to the inside of tube 262 is hollow cylindrical sliding tube 268. The longitudinal axis of sliding tube 268 is aligned with the longitudinal axis of tube 262. Sliding tube 268 slides longitudinally on the inside of tube 262 as indicated by the arrow 269 in FIG. 11.

The outside diameter of sliding tube 268 is selected to enable a sliding frictional fit between the inside of tube 262 and the outside of tube 268 sufficient to hold tubes 262 and 268 stationary after the tubes slide to the desired longitudinal location relative to each other.

Sliding tube 268 has an inside open end 268*a* and an outside open end 268*b*. Open end 268*b* defines a face plane which is perpendicular to the longitudinal axis of sliding tube 268.

An audio driver\speaker generally indicated by the numeral 270 is rigidly connected to the open end 268*b* of sliding tube 268. Driver/speaker 270 includes an acoustical generating cone 272 protected by wire screen 270*a* driven into vibration by a standard electromagnetic circuit member 274 of common construction as shown in FIG. 11. Audio electrical signals from a standard amplifier, not shown, supplied to electromagnetic circuit member 274 through an insulated wire, not shown, vibrate cone 270, creating acoustical or sound energy.

Acoustical energy is radiated from the outside of cone 272 outwardly from the open end 268*b* of sliding tube 268. Useful acoustical energy is radiated from the rear of cone 272 into sliding tube 268 and 262. Acoustical energy entering tube 262 from cone 272 reflects off of wall 264 and the interior sidewalls of tube 262, and a portion of the acoustical energy exits through opening 263 to the outside of speaker enclosure 260.

To vary the acoustical quality and characteristics of the acoustical energy emanating from opening 263, sliding tube 268 may be slidably moved to varying longitudinal locations on the inside of tube 262 as desired by the listener. Speaker enclosure 260 may thus be "tuned" by the listener in the vehicle in which speaker enclosure 260 is located by sliding tube 268 to various locations in tube 262 to achieve a desired acoustical effect. Sliding tube 268 may be moved longitudinally inside tube 262 to a position where the end 268*b* of sliding tube 268 is located outside of tube 262.

Figure 12:
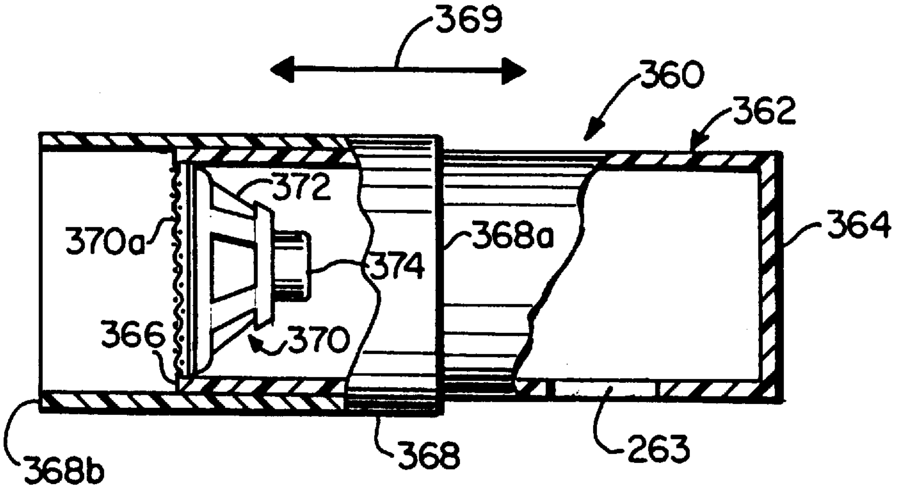
FIG. 12 is a perspective view, partly cut-away, of a seventh embodiment of the speaker enclosure of the invention.

In FIG. 12 is shown a seventh embodiment of the invention generally indicated by the numeral 360. Speaker enclosure 360 includes a hollow cylindrical tube generally indicated by the numeral 362 having a circular wall 364 rigidly connected to one end. Circular wall 364 closes one end of tube 362. The other end 366 of tube 362 is open. A circular opening 363 in the sidewall of tube 362 allows air from the outside of speaker enclosure 360 to move in and out of tube 362. Therefore sound waves reflect off of the interior cylindrical sidewalls of tube 362 and off of wall 364 rather than traveling therearound, and escape from the interior of tube 362 through opening 363. If desired, a hollow tube could be fitted in opening 363 similar to tube 212*d* in FIG. 5.

Slidably connected to the outside of tube 362 is hollow cylindrical sliding tube 368. The longitudinal axis of sliding tube 368 is aligned with the longitudinal axis of tube 362. Sliding tube 368 slides longitudinally on the outside of tube 362 as indicated by the arrow 369 in FIG. 11.

The inside diameter of sliding tube 368 is selected to enable a sliding frictional fit between the outside of tube 362 and the inside of tube 368 sufficient to hold tubes 362 and 368 stationary after the tubes slide to the desired longitudinal location relative to each other.

Sliding tube 369 has an open end 368*a* and an open end 368*b*. Open end 368*b* defines a face plane which is perpendicular to the longitudinal axis of sliding tube 368.

An audio driver\speaker generally indicated by the numeral 370 is rigidly connected to the open end 366 of tube 362. Driver/speaker 370 includes an acoustical generating cone 372 protected by wire screen 370*a* driven into vibration by a standard electromagnetic circuit member 374 of common construction as shown in FIG. 12. Audio electrical signals from a standard amplifier, not shown, supplied to electromagnetic circuit member 374 through an insulated wire, not shown, vibrate cone 370, creating acoustical or sound energy.

Acoustical energy is radiated from the outside of cone 372 outwardly from the open end 366 of tube 362. Useful acoustical energy is radiated from the rear of cone 372 into tube 362. Acoustical energy entering tube 362 from cone 372 reflects off of wall 364 and the interior sidewalls of tube 362, and a portion of the acoustical energy exits through opening 363 to the outside of speaker enclosure 360.

To vary the acoustical quality and characteristics of the acoustical energy emanating from opening 366, sliding tube 368 may be slidably moved to varying longitudinal locations on the outside of tube 362 as desired by the listener. Speaker enclosure 360 may thus be "tuned" by the listener in the vehicle in which speaker enclosure 360 is located by sliding tube 368 to various locations on tube 362 to achieve a desired acoustical effect.

Tubes 12*g*, 12*h*, 212*c*, 312*c* and 312*d* may be any desired length. The tubes 212*c*, 312*c* and 312*d* may also be omitted, though not preferred, leaving the openings in which the tubes were fitted for releasing acoustical energy and sound waves in the tubes to the exterior of the speaker enclosure. Tubes 14, 16, 18, 20, 114, 116, 118, 120, 122, 124, 214, 218, 162, 168, 312, 318, 320, 262, 268, 362, and 368 may also be any desired length. Preferably, all speaker enclosures are small enough to fit inside of a motor vehicle. Furthermore, where the sliding tube is shown fitting over the stationary tube, the sliding tube could be placed inside the stationary tube, and vice versa.

Although the preferred embodiments of the invention have been described in detail above, it should be understood that the invention is in no sense limited thereby, and its scope is to be determined by that of the following claims:

What is claimed is:

1. An extensible speaker assembly for use in a motor vehicle comprising a pair of tubular cylinders, one of which is slidable inside the other, the first of said tubular cylinders having one end closed, one end open, and an opening in the wall thereof, and the second of said tubular cylinders having one end open and a speaker in the other end thereof.

2. An extensible speaker assembly for use in a motor vehicle consisting of a pair of tubular cylinders, one of which is slidable inside the other, the first of said tubular cylinders having one end closed, one end open, and an opening in the wall thereof, and the second of said tubular cylinders having one end open and a speaker in the other end thereof.

* * * * *